United States Patent
Todo et al.

(10) Patent No.: US 12,548,744 B2
(45) Date of Patent: Feb. 10, 2026

(54) PLASMA PROCESSING APPARATUS, CONTROL METHOD, AND STORAGE MEDIUM FOR SUPPRESSING DETERIORATION EFFECTS FROM WEAR OF AN EDGE RING

(71) Applicant: Tokyo Electron Limited, Tokyo (JP)

(72) Inventors: Soya Todo, Boise, ID (US); Ryohei Takeda, Miyagi (JP); Muneyuki Omi, Miyagi (JP); Shin Okamoto, Boise, ID (US); Joji Takayoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 525 days.

(21) Appl. No.: 17/961,589

(22) Filed: Oct. 7, 2022

(65) Prior Publication Data

US 2023/0111278 A1    Apr. 13, 2023

(30) Foreign Application Priority Data

Oct. 7, 2021 (JP) .................... 2021-165745

(51) Int. Cl.
*H01L 21/3065* (2006.01)
*H01J 37/32* (2006.01)

(52) U.S. Cl.
CPC .. *H01J 37/32926* (2013.01); *H01J 37/32091* (2013.01); *H01J 37/32642* (2013.01);
(Continued)

(58) Field of Classification Search
CPC ........... H01J 37/32027; H01J 37/32082; H01J 37/32165; H01J 37/32174;
(Continued)

(56) References Cited

U.S. PATENT DOCUMENTS 6,095,084 A * 8/2000 Shamouilian ..... H01J 37/32559
156/345.47
6,896,765 B2 * 5/2005 Steger ............... H01J 37/32623
118/728

(Continued)

FOREIGN PATENT DOCUMENTS

JP 2007-258417 A 10/2007
JP 2017028092 A * 2/2017

OTHER PUBLICATIONS

Machine translation of Abstract of JP 2017028092A (Year: 2017).*

*Primary Examiner* — Alvin H Tan
(74) *Attorney, Agent, or Firm* — XSENSUS LLP

(57) ABSTRACT

The present disclosure provides a non-transitory computer-readable storage medium storing a control program of a plasma processing apparatus which performs a plasma processing by supplying a source power to a plasma generator and supplying a bias power to a stage that places a processing target substrate thereon. The control program causes a computer to execute a process including: monitoring a peak-to-peak voltage value of the source power or the bias power; and correcting the source power supplied to the plasma generator and the bias power supplied to the stage according to a fluctuation of the peak-to-peak voltage value, to make the monitored peak-to-peak voltage value approach an initial set value while fixing a ratio of the source power and the bias power.

15 Claims, 10 Drawing Sheets

(52) U.S. Cl.
CPC ............... *H01J 2237/24564* (2013.01); *H01J 2237/3343* (2013.01)

(58) Field of Classification Search
CPC .......... H01J 37/32091; H01J 37/32009; H05H 1/46; H05H 1/4645; H05H 1/466; H01L 21/3065; H01L 21/67069; H01L 21/67213; H01L 21/6833
See application file for complete search history.

(56) References Cited

U.S. PATENT DOCUMENTS

| | | | | |
|---|---|---|---|---|
| 7,224,568 | B2* | 5/2007 | Ishimura | H01J 37/32706 |
| | | | | 361/234 |
| 7,754,610 | B2* | 7/2010 | Lee | H01L 21/32136 |
| | | | | 438/689 |
| 7,771,608 | B2* | 8/2010 | Sumiya | H01J 37/32091 |
| | | | | 438/714 |
| 7,902,991 | B2* | 3/2011 | Park | H01J 37/32174 |
| | | | | 315/111.21 |
| 8,642,478 | B2* | 2/2014 | Ooya | H01J 37/32165 |
| | | | | 438/723 |
| 9,566,821 | B2* | 2/2017 | Ichino | H01L 21/6831 |
| 10,672,589 | B2* | 6/2020 | Koshimizu | H01J 37/32642 |
| 10,818,535 | B2* | 10/2020 | Eto | H01J 37/32082 |
| 10,964,578 | B2* | 3/2021 | Sung | H01J 37/32146 |
| 2002/0139480 | A1* | 10/2002 | Nakajima | H01J 37/321 |
| | | | | 156/345.48 |
| 2020/0227326 | A1* | 7/2020 | Oikawa | H01J 37/32091 |

* cited by examiner

*FIG. 7*

| ITEM | VALUE | UNIT |
|---|---|---|
| Estimation (FRDC) | | |
| FRDC_Current | NA1 | V |
| FRDC_Delta | NA1 | V |
| FRDC(Optimized) | NA1 | V |
| Estimation (RF Power) | | |
| LF_Power_Current | NB1 | W |
| LF_Power_Delta | NB1 | W |
| LF_Power_Delta(Pecentage) | NB1 | % |
| LF_Power(Optimized) | NB1 | W |
| HF_Power_Current | NC1 | W |
| HF_Power_Delta | NC1 | W |
| HF_Power_Delta(Pecentage) | NC1 | % |
| HF_Power(Optimized) | NC1 | W |

PLASMA PROCESSING APPARATUS, CONTROL METHOD, AND STORAGE MEDIUM FOR SUPPRESSING DETERIORATION EFFECTS FROM WEAR OF AN EDGE RING

CROSS-REFERENCE TO RELATED APPLICATION

This application is based on and claims priority from Japanese Patent Application No. 2021-165745, filed on Oct. 7, 2021, with the Japan Patent Office, the disclosure of which is incorporated herein in its entirety by reference.

TECHNICAL FIELD

The present disclosure relates to a plasma processing apparatus, a control method, and a storage medium.

BACKGROUND

A plasma processing apparatus is used for a plasma processing performed on a substrate. In a chamber of the plasma processing apparatus, the substrate is placed within a region surrounded by an outer peripheral member called an edge ring or a focus ring.

When the plasma processing apparatus performs the plasma processing, the outer peripheral member is worn down, and thus, its thickness is reduced. As the thickness of the outer peripheral member is reduced, the position of the upper end of a sheath above the outer peripheral member becomes lower. When the position of the upper end of the sheath above the outer peripheral member becomes low, ions from plasma strike the edge of the substrate at an oblique angle. As a result, an opening formed at the edge of the substrate is tilted. Japanese Laid-Open Patent Publication No. 2007-258417 discloses applying a DC voltage to the outer peripheral member in order to suppress the tilting of the opening formed at the edge of the substrate.

SUMMARY

An embodiment of the present disclosure provides a non-transitory computer-readable storage medium storing a control program of a plasma processing apparatus which performs a plasma processing by supplying a source power to a plasma generator and supplying a bias power to a stage that places a processing target substrate thereon. The control program causes a computer to execute a process including: monitoring a peak-to-peak voltage value of the source power or the bias power; and correcting the source power supplied to the plasma generator and the bias power supplied to the stage according to a fluctuation of the peak-to-peak voltage value, to make the monitored peak-to-peak voltage value approach an initial set value while fixing a ratio of the source power and the bias power.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is a view illustrating an example of an output of correction values.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Embodiment 1

Figure 1:
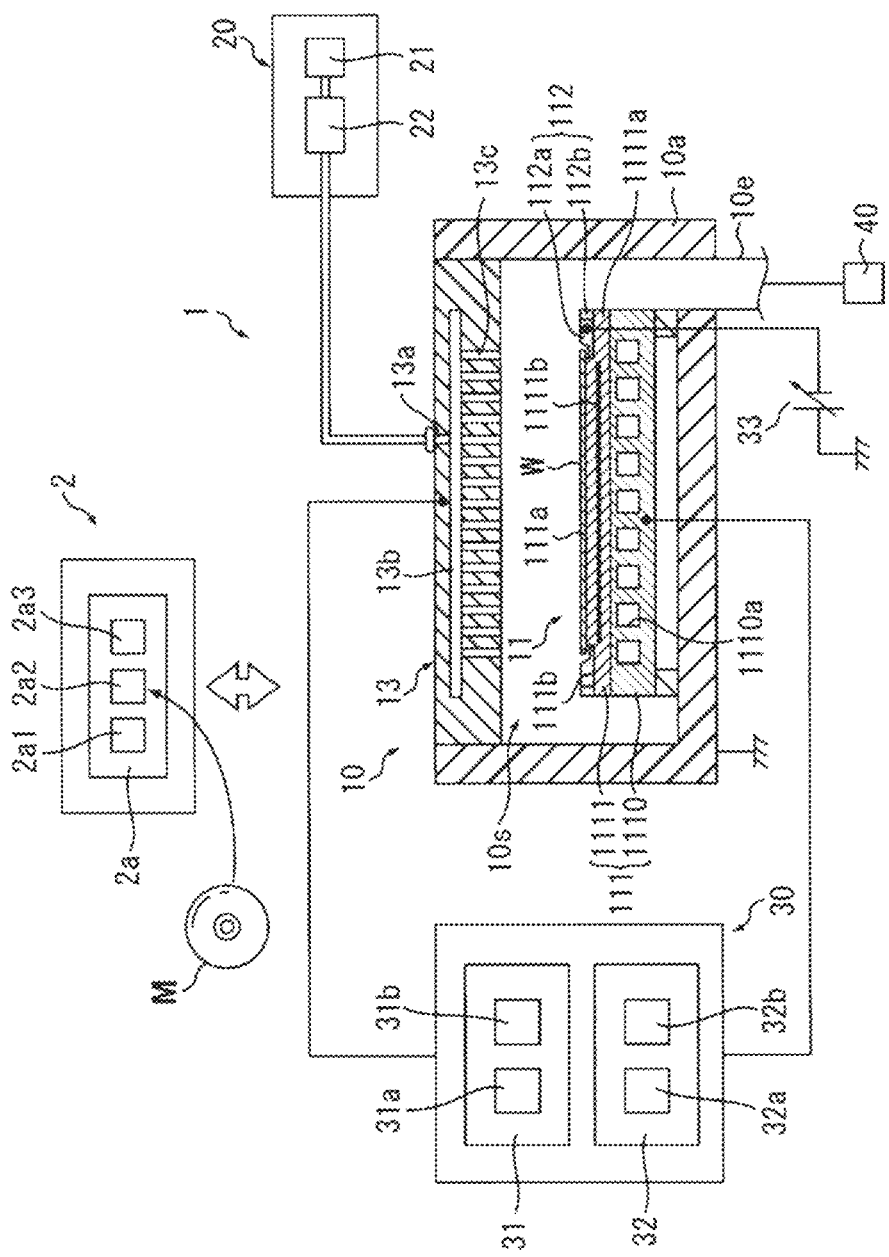
FIG. 1 is a view illustrating an example of a configuration of a capacitively coupled plasma processing apparatus.

Hereinafter, an example of a configuration of a plasma processing system will be described. FIG. 1 is a view illustrating an example of a configuration of a capacitively coupled plasma processing apparatus.

The plasma processing system includes a capacitively coupled plasma processing apparatus 1 and a control unit 2. The capacitively coupled plasma processing apparatus 1 includes a plasma processing chamber 10, a gas supply unit 20, a power supply 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support 11. The plasma processing chamber 10 includes at least one gas supply port for supplying at least one processing gas to the plasma processing space 10s, and at least one gas discharge port for discharging a gas from the plasma processing space. The plasma processing chamber 10 is grounded. The shower head 13 and the substrate support 11 are electrically insulated from the housing of the plasma processing chamber 10.

The substrate support 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in a plan view. The substrate W is placed on the central region 111a of the main body 111, and the ring assembly 112 is disposed on the annular region 111b of the main body 111 to surround the substrate W placed on the central region 111a of the main body 111. Accordingly, the central region 111a is also referred to as a substrate support surface for supporting the substrate W, and the annular region 111b is also referred to as a ring support surface for supporting the ring assembly 112.

In an embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has the central region 111a. In an embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio-frequency (RF) power supply 31 and/or a direct current (DC) power supply 32 to be described later may be disposed inside the ceramic member 1111a. In this case, at least one RF/DC electrode functions as a lower electrode. When a bias RF signal and/or a DC signal to be described later is supplied to at least one RF/DC electrode, the RF/DC electrode is also referenced as a bias electrode. Further, the conductive member of the base 1110 and at least one RF/DC electrode may function as a plurality of lower electrodes. The electrostatic electrode 1111b may function as a lower electrode. Thus, the substrate support 11 includes at least one lower electrode.

The ring assembly 112 includes one or more annular members. In an embodiment, the one or more annular members include one or more edge rings and at least one cover ring. The edge ring is made of a conductive material or an insulating material, and the cover ring is made of an insulating material. The edge ring is also called a focus ring (FR). The ring assembly 112 illustrated in FIG. 1 includes an annular edge ring 112a and an annular cover ring 112b disposed around the edge ring 112a.

The substrate support 11 may include a temperature adjustment module configured to adjust at least one of the electrostatic chuck 1111, the ring assembly 112, and the substrate to a target temperature. The temperature adjustment module may include a heater, a heat transfer medium, a flow path 1110a, or a combination thereof. A heat transfer fluid such as brine and a gas flows through the flow path. In an embodiment, the flow path 1110a is formed inside the base 1110, and one or more heaters are disposed inside the ceramic member 1111a of the electrostatic chuck 1111. The substrate support 11 may include a heat transfer gas supply unit configured to supply a heat transfer gas to the gap between the back surface of the substrate W and the central region 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include one or a plurality of side gas injectors (SGI) attached to one or a plurality of openings formed in the side wall 10a, in addition to the shower head 13.

The gas supply unit 20 may include at least one gas source 21 and at least one flow rate controller 22. In an embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. The gas supply unit 20 may further include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. Thus, plasma is formed from at least one processing gas supplied to the plasma processing space 10s. Accordingly, the RF power supply 31 may function as at least a portion of a plasma generation unit configured to generate plasma from one or more processing gases in the plasma processing chamber 10. By supplying a bias RF signal to at least one lower electrode, a bias potential is generated in the substrate W so that ion components in formed plasma may be drawn into the substrate W.

In an embodiment, the RF power supply 31 includes a first RF generation unit 31a and a second RF generation unit 31b. The first RF generation unit 31a is coupled to at least one lower electrode and/or at least one upper electrode via at least one impedance matching circuit, and configured to generate a source RF signal (source RF power) for generating plasma. In an embodiment, the source RF signal has a frequency in the range of 10 MHz to 150 MHz. In an embodiment, the first RF generation unit 31a may be configured to generate a plurality of source RF signals with different frequencies. One or more generated source RF signals are supplied to at least one lower electrode and/or at least one upper electrode. Hereinafter, a peak-to-peak voltage of the source RF signal will also be referred to as HF_Vpp, and the source RF power (source power) will also be referred to as HF_pw.

The second RF generation unit 31b is coupled to at least one lower electrode via at least one impedance matching circuit, and configured to generate a bias RF signal (bias RF power). The frequency of the bias RF signal may be the same as or different from the frequency of the source RF signal. In an embodiment, the bias RF signal has a frequency lower than that of the source RF signal. In an embodiment, the bias RF signal has a frequency in the range of 100 kHz to 60 MHz. In an embodiment, the second RF generation unit 31b may be configured to generate a plurality of bias RF signals having different frequencies. The generated one or more bias RF signals are supplied to at least one lower electrode. In various embodiments, at least one of the source RF signal and the bias RF signal may be pulsed. Hereinafter, a peak-to-peak voltage of the bias RF signal will also be referred to as LF_Vpp, and the bias RF power (bias power) will also be referred to as LF_pw. The source RF power and the bias RF power will also be referred to as RF_pw when they do not need to be discriminated from each other.

The power supply 30 may further include a DC power supply 32 coupled to the plasma processing chamber 10. The DC power supply 32 includes a first DC generation unit 32a and a second DC generation unit 32b. In an embodiment, the first DC generation unit 32a is connected to at least one lower electrode, and configured to generate a first DC signal. The generated first DC signal is applied to at least one lower electrode. In an embodiment, the second DC generation unit 32b is connected to at least one upper electrode, and configured to generate a second DC signal. The generated second DC signal is applied to at least one upper electrode.

In various embodiments, at least one of the first and second DC signals may be pulsed. In this case, a sequence of the pulse voltage is applied to at least one lower electrode and/or at least one upper electrode. The pulse voltage may have rectangular, trapezoidal, or triangular pulse waveforms, or combinations thereof. In an embodiment, a waveform generation unit is connected between the first DC generation unit 32a and at least one lower electrode to generate the sequence of the pulse voltage from the DC signal. Thus, the first DC generation unit 32a and the waveform generation unit make up a pulse voltage generation unit. When the second DC generation unit 32b and the waveform generation unit make up the pulse voltage generation unit, the pulse voltage generation unit is connected to at least one upper electrode. The pulse voltage may have a positive polarity or a negative polarity. The sequence of the pulse voltage may include one or more positive pulse voltages and one or more negative pulse voltages in one cycle. The first and second DC generation units 32a and 32b may be provided in addition to the RF power supply 31, and the first DC generation unit 32a may be provided in place of the second RF generation unit 31b.

The plasma processing system may further include a variable DC power supply 33 coupled to the edge ring 112a. In an embodiment, the variable DC power supply 33 is connected to the edge ring 112a, and configured to generate a third DC signal. The generated DC signal is applied to the edge ring 112a. Hereinafter, the voltage of the third DC signal applied to the edge ring 112a will also be referred to as FRDC_V.

The exhaust system 40 may be connected to a gas outlet 10e provided at, for example, the bottom of the plasma processing chamber 10. The exhaust system 40 may include a pressure regulating valve and a vacuum pump. The pressure in the plasma processing space 10s is adjusted by the pressure adjusting valve. The vacuum pump may include a turbo molecular pump, a dry pump, or a combination thereof.

The control unit 2 processes computer-executable commands for causing the plasma processing apparatus 1 to execute various steps described therein. The control unit 2 may be configured to control respective components of the plasma processing apparatus 1 to perform the various steps described herein. In an embodiment, a portion of the control unit 2 or the entire control unit 2 may be included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to read a program from the storage unit 2a2, and perform various control operations by executing the read program. The program may be stored in advance in the storage unit 2a2, or may be acquired via a medium when necessary. The acquired program is stored in the storage unit 2a2, and read from the storage unit 2a2 to be executed by the processing unit 2a1. The medium may be various storage media M readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2A:
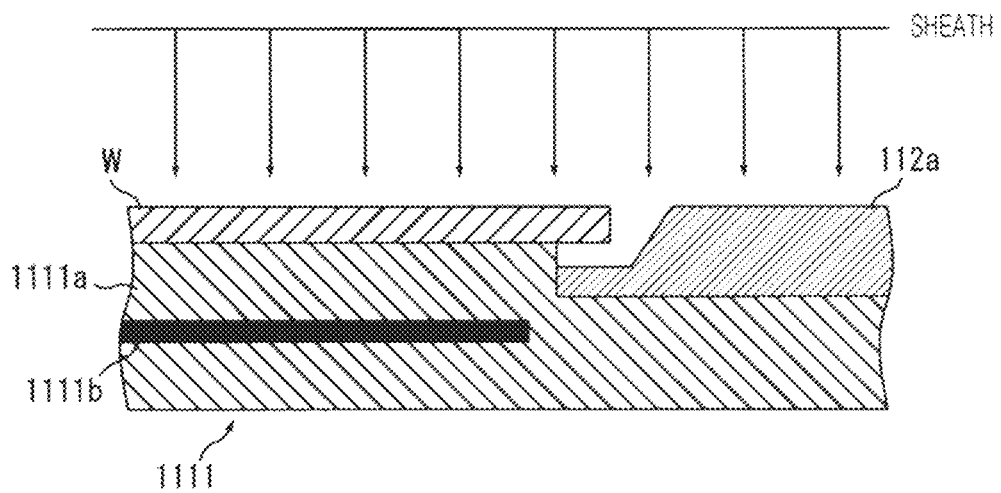
FIG. 2A is a view illustrating a change of tilting caused from a wear of an edge ring.
Figure 2B:
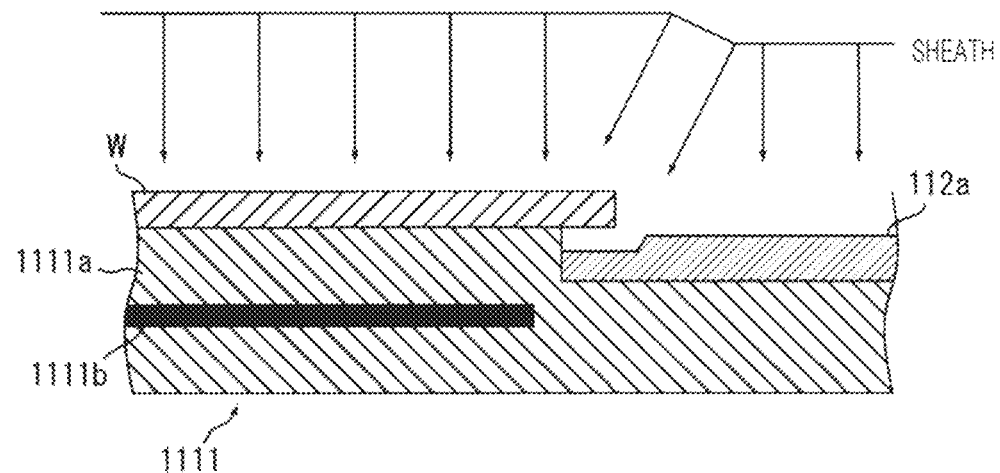
FIG. 2B is a view illustrating a change of tilting caused from a wear of an edge ring.

Next, a change of a sheath and an occurrence of tilting which are caused by the wear of the edge ring 112a will be described. FIGS. 2A and 2B are views illustrating a change of tilting caused from the wear of the edge ring 112a.

FIG. 2A illustrates a state of the edge ring 112a which is not worn down. The edge ring 112a is disposed in the annular region 111b of the substrate support 11 as a portion of the ring assembly 112. The thickness of the edge ring 112a is designed such that the height of the upper surface of the edge ring 112a is the same as the height of the upper surface of the wafer W when the edge ring 112a is disposed in the annular region 111b. When no wear of the edge ring 112a occurs, a sheath above the wafer W and a sheath above the edge ring 112a which are generated during a plasma processing have the same thickness, and thus, no step occurs.

At this time, an irradiation angle of ions with respect to the wafer W and the edge ring 112a is substantially vertical to the surfaces of the wafer W and the edge ring 112a. As a result, the shape of a recess formed in the wafer W (etching shape) becomes substantially vertical in any of the central region and the peripheral edge region of the wafer W, and a tilting in which the shape of the recess becomes oblique does not occur.

In the plasma processing, the edge ring 112a is gradually worn down by being exposed to plasma. FIG. 2B illustrates a state of the worn-down edge ring 112a. When the thickness of the edge ring 112a is reduced due to the wear of the edge ring 112a, the upper surface of the edge ring 112a becomes lower than the upper surface of the wafer W. As a result, as illustrated in FIG. 2B, a step occurs between the sheath above the edge ring 112a and the sheath above the wafer W.

As a result of the occurrence of step between the sheaths, the irradiation direction of ions becomes oblique in the peripheral edge region of the wafer W as indicated by arrows in FIG. 2B, and a tilting in which the shape of the recess formed in wafer W becomes oblique occurs.

As not only the edge ring 112a described above but also other members disposed in the plasma processing chamber 10 are worn, process characteristics in the plasma processing apparatus 1 deteriorate. Here, the members disposed in the plasma processing chamber 10 include, for example, the cover ring 112b, the substrate support 11, the upper electrode, and the inner wall of the plasma processing chamber 10, in addition to the edge ring 112a. Further, the plasma processing chamber 10 has an individual difference (machine difference), and plasma characteristics differ among a plurality of plasma processing apparatuses 1.

The plasma processing system according to the present embodiment frequently monitors the state of the plasma processing apparatus 1 during the execution of the plasma processing, and autonomously controls various parameters. As a result, the plasma processing system according to the present embodiment suppresses the deterioration of the process characteristics caused from the wear of the members, so as to reduce the individual difference in process characteristics among the plurality of plasma processing apparatuses 1. Hereinafter, the process executed by the control unit 2 of the plasma processing system will be described.

(1) Correction of FRDC_V

Figure 3:
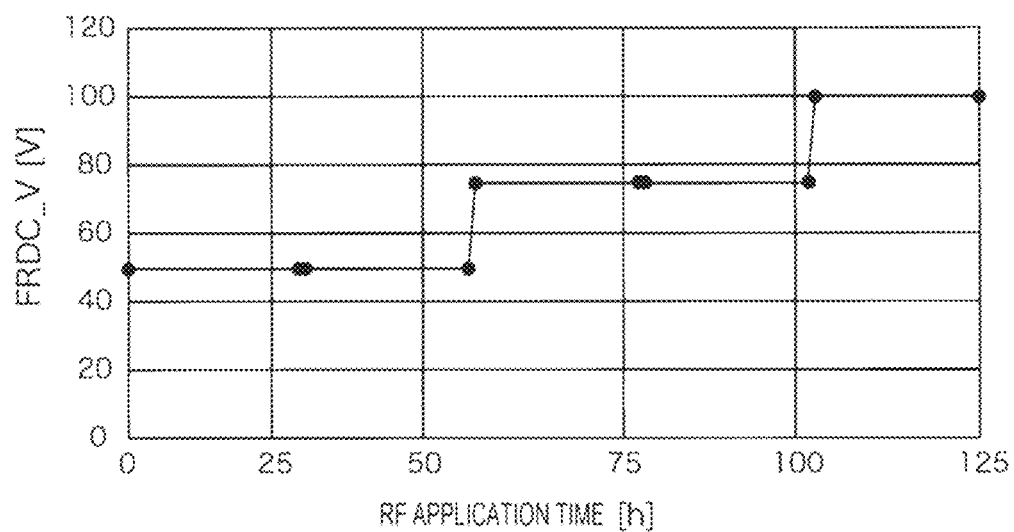
FIG. 3 is a graph illustrating a method of correcting FRDC_V.

The control unit 2 corrects FRDC_V according to an RF application time as a countermeasure against the wear of the members. FIG. 3 is a graph illustrating a method of correcting FRDC_V. In the graph, the horizontal axis represents the RF application time, and the vertical axis represents FRDC_V. Here, the RF application time represents a time during which the source RF signal and the bias RF signal are supplied from the first RF generation unit 31a and the second RF generation unit 31b, respectively. FRDC_V is a DC voltage value applied to the edge ring 112a.

In an embodiment, the control unit 2 increases FRDC_V by a predetermined increase amount each time the RF application time elapses by 50 hours. For example, the increase amount is 25 V until 200 hours elapse, and is 12.5 V after the elapse of 200 hours. When FRDC_V reaches an upper limit (e.g., 300 V), the control unit 2 maintains the upper limit. The time interval for correcting FRDC_V and the increase amount when FRDC_V is corrected are not limited to those described above, and may be appropriately designed.

(2) Correction of LF_pw

LF_Vpp increases due to an influence of a change resulting from a time elapse or a fluctuation of FRDC_V. Product characteristics may deteriorate with the increase of LF_Vpp. In order to suppress the deterioration of the product characteristics, the control unit 2 corrects LF_pw to match initial Vpp. Here, the initial Vpp is set to an average value of LF_Vpp until a predetermined time (e.g., 50 hours) elapses in a seasoning process after a replacement of a consumable. The initial Vpp may be calculated by the control unit 2 each time a consumable such as the edge ring 112a is replaced (each time the RF application time is reset to 0). The control unit 2 may use another statistical value such as a median value or a moving average as the initial Vpp, instead of the average value of LF_Vpp.

Figure 4:
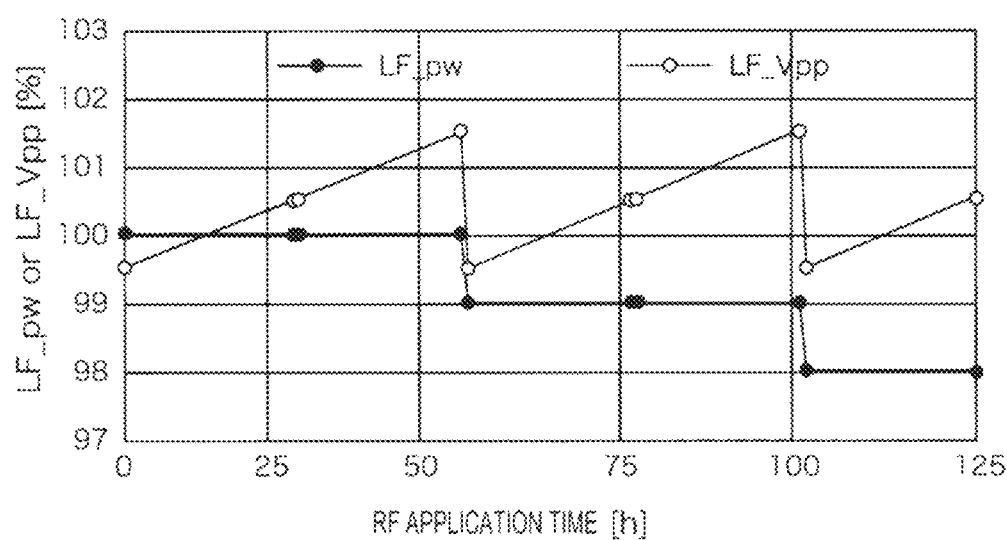
FIG. 4 is a graph illustrating an example of a correction of LF_pw.

FIG. 4 is a graph illustrating an example of the correction of LF_pw. In the graph, the horizontal axis represents the RF application time, and the vertical axis represents LF_pw and LF_Vpp. The RF application time represents an elapsed time after the plasma processing is actually started since the end of the seasoning process. LF_pw and LF_Vpp are expressed as change rates (%) with respect to appropriate reference values. As described above, LF_Vpp increases due to the influence of the change resulting from a time elapse or the fluctuation of FRDC_V. The graph of FIG. 4 represents that LF_Vpp monotonically increases, for example, during a time from the start of the plasma processing until the RF application time elapses by 50 hours, and during a time from the elapse of 50 hours until an elapse of 100 hours. In the present embodiment, the control unit 2 suppresses the increase of LF_Vpp by correcting LF_pw.

The control unit 2 corrects LF_pw by using, for example, a correction formula represented by Equation 1 below.

$$\text{COR LF\_pw} = f(\text{average LF\_Vpp}, \text{initial LF\_Vpp}, \text{Cor FRDC\_V}, \alpha, \beta) \quad [\text{Equation 1}]$$

Here, Cor LF_pw represents a correction amount with respect to a current value of the bias power. As represented in Equation 1, the bias power correction amount Cor LF_pw is expressed by a function of average LF_Vpp (average Vpp), initial LF_Vpp (initial Vpp), Cor FRDC (correction amount of FRDC_V), and correction coefficients $\alpha$ and $\beta$. The functional form of Equation 1 is determined such that the correction amount Cor LF_pw has a negative value.

The control unit 2 corrects LF_pw according to Equation 1, for example, at the timing when FRDC_V is corrected. LF_pw is reduced by the correction. The graph of FIG. 4 represents that LF_pw is corrected along with the correction of FRDC_V each time the RF application time elapses by 50 hours. As a result of the correction, LF_pw is reduced in stages by about 1% per stage. Further, as a result of the correction of LF_pw, LF_Vpp is corrected to match the initial Vpp.

While the graph of FIG. 4 represents an example in which LF_pw is corrected at the timing when FRDC_V is corrected, the control unit 2 may be configured to monitor LF_Vpp and correct LF_pw when the fluctuation of LF_Vpp exceeds a threshold value. The threshold value is set based on, for example, the initial Vpp. In an example, the threshold value is set to the initial Vpp×1.005.

(3) Correction of HF_pw

HF_Vpp increases due to the influence of the correction of LF_pw. With the increase of HF_Vpp, the product characteristics may deteriorate. The control unit 2 corrects HF_pw in order to suppress the deterioration of the product characteristics.

Figure 5:
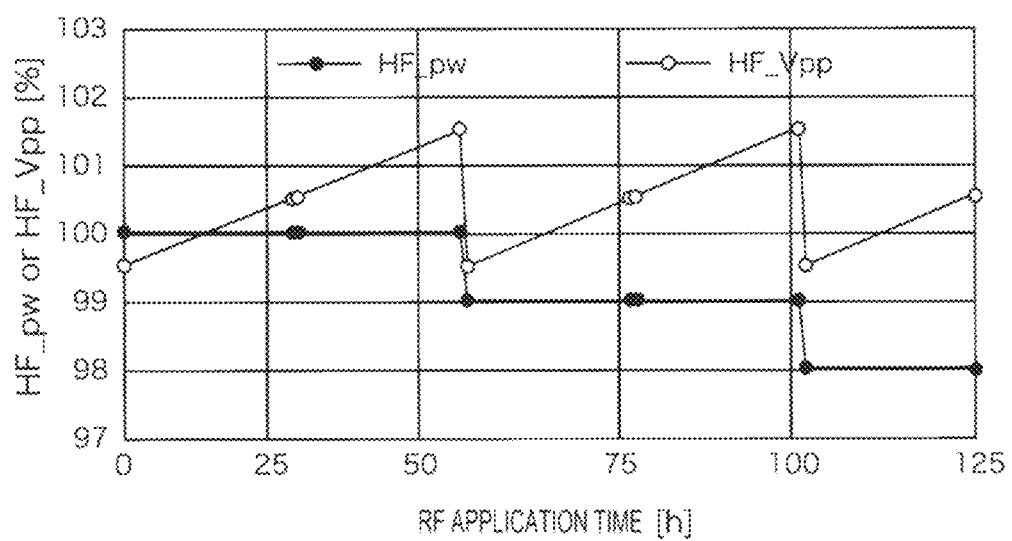
FIG. 5 is a graph illustrating an example of a correction of HF_pw.

FIG. 5 is a graph illustrating an example of the correction of HF_pw. In the graph, the horizontal axis represents the RF application time, and the vertical axis represents HF_pw and HF_Vpp. The RF application time represents the elapsed time after the plasma processing is actually started since the end of the seasoning process. HF_pw and HF_Vpp are expressed as change rates (%) with respect to appropriate reference values. HF_Vpp increases due to the influence of the fluctuation of LF_pw. In the present embodiment, the control unit 2 suppresses the increase of HF_Vpp by correcting HF_pw.

The control unit 2 corrects HF_pw by using, for example, a correction formula represented by Equation 2 below.

$$\text{Cor HF\_pw} = f(\text{Cor LF\_pw}, \gamma) \quad [\text{Equation 2}]$$

Here, Cor HF_pw represents a correction amount with respect to a current value of the source power. As represented in Equation 2, the source power correction amount Cor HF_pw is expressed as a function of Cor HF_pw and a correction coefficient $\gamma$. The functional form of Equation 2 is determined such that the ratio of the source power and the bias power is fixed.

Hereinafter, a procedure for correcting FRDC_V and RF_pw will be described.

Figure 6:
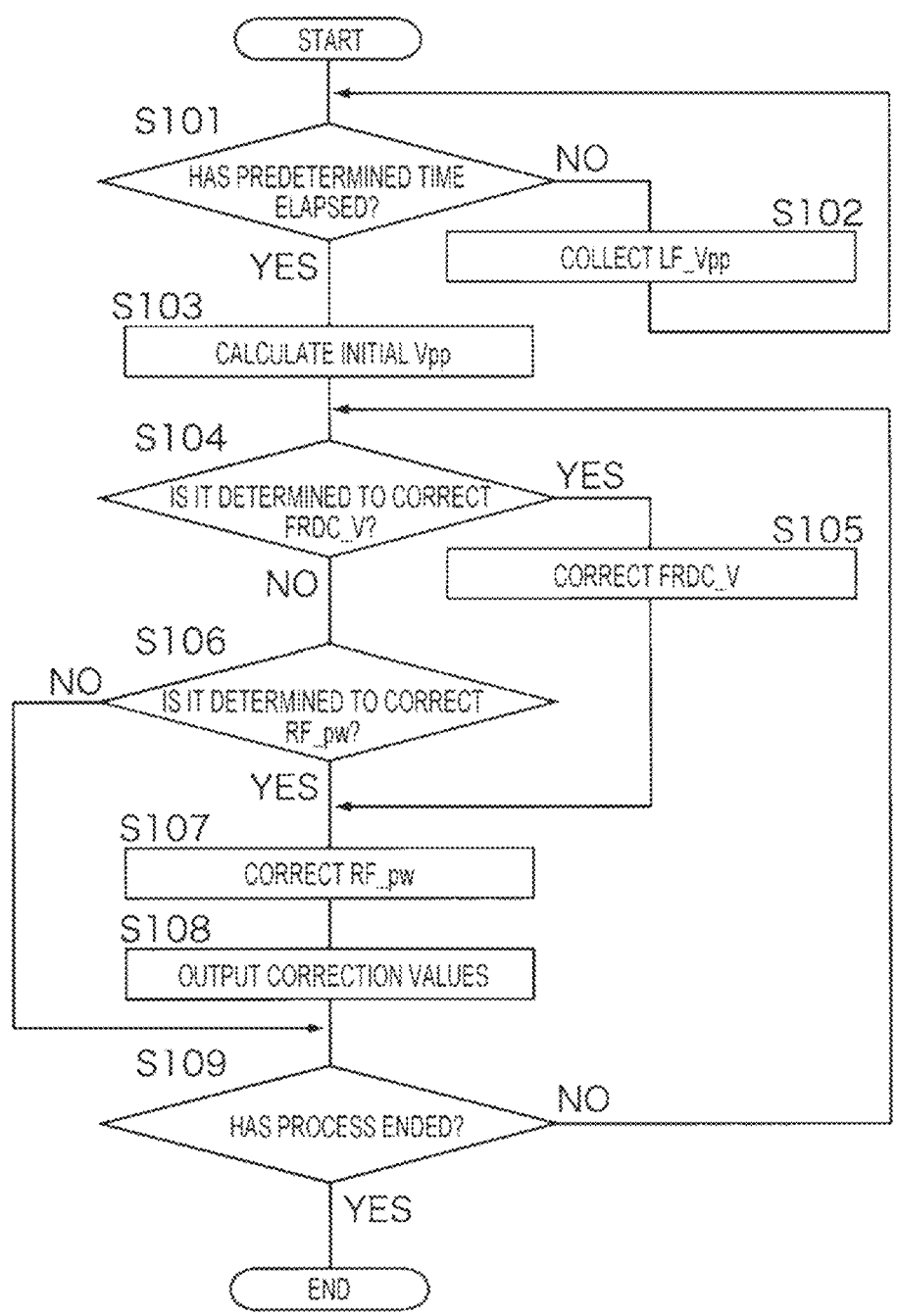
FIG. 6 is a flowchart illustrating a procedure for executing a correction process according to Embodiment 1.

FIG. 6 is a flowchart illustrating the execution procedure of the correction process according to Embodiment 1. After consumables including the edge ring 112a in the plasma processing apparatus 1 are replaced, and a process according to a recipe defining process steps is started, the control unit 2 executes the following procedure. The control unit 2 counts an elapsed time from the start of the process in the plasma processing apparatus 1, and determines whether a predetermined time (e.g., 25 hours) has elapsed (step S101).

When it is determined that the predetermined time has not elapsed (S101: NO), the control unit 2 collects the value of LF_Vpp (step S102). The control unit 2 stores the collected values of LF_Vpp in association with timings in the storage unit 2a2, and returns the process to step S101.

When it is determined that the predetermined time has passed (S101: YES), the control unit 2 calculates the initial Vpp based on the values of LF_Vpp stored in the storage unit 2a2 (step S103). The control unit 2 calculates the average value of LF_Vpp stored in the storage unit 2a2 as the initial Vpp. Alternatively, the control unit 2 may calculate a median value or a moving average of LF_Vpp stored in the storage unit 2a2 as the initial Vpp. The control unit 2 stores the calculated initial Vpp in the storage unit 2a2.

Next, the control unit 2 determines whether to correct FRDC_V (step S104), In the present embodiment, the control unit 2 corrects FRDC_V each time the RE application time elapses by 50 hours. In this case, the control unit 2 may determine whether to correct FRDC_V, by determining whether 50 hours have elapsed since the start of the process or whether 50 hours have elapsed since a previous correction.

When it is determined in step S104 to perform the correction (S104: YES), the control unit 2 corrects FRDC_V (step S105). The control unit 2 increases FRDC applied to the edge ring 112a by a predetermined increase amount, by controlling the operation of the variable DC power supply 33. It is assumed that the increase amount is stored in advance in the storage unit 2a2. In an example, the increase amount is 25 V until the RF application time elapses by total 200 hours, and is 12.5 V after the elapse of 200 hours. After correcting FRDC_V, the control unit 2 executes the process of step S107 to be described later, so as to correct RF_pw as well.

When it is determined in step S104 not to perform the correction (S104: NO), the control unit 2 determines whether to correct RF_pw (step S106). The control unit 2 monitors LF_Vpp, and may determine to correct RF_pw, for example, when the average LF_Vpp exceeds a threshold value. The threshold value is set to, for example, a value which is 1.005 times the initial Vpp calculated in step S103.

When it is determined in step S106 not to correct RF_pw (S106: NO), the control unit 2 executes the processes of step S109 and its subsequent step.

When it is determined in step S106 to correct RF_pw (S106: YES) or when FRDC_V is corrected in step S105, the control unit 2 corrects RF_pw (step S107). In step S107, the control unit 2 corrects both the bias power and the source power.

The control unit 2 calculates a correction amount of LF_pw according to the current average LF_Vpp, the initial LF_Vpp, and the correction amount of FRDC_V, based on, for example, Equation 1. Further, the control unit 2 calculates a correction amount of HF_pw such that HF_Vpp may be maintained while fixing the ratio of HF_pw and LF_pw, based on, for example, Equation 2. The control unit 2 may calculate the values of corrected LF_pw and HF_pw based on the calculated correction amounts of LF_pw and HF_pw.

The control unit 2 controls the first RF generation unit 31a to generate a source RF signal (source RF power) which satisfies corrected HF_pw. The generated source RF signal (source RF power) is supplied to at least one lower electrode and/or at least one upper electrode. Further, the control unit 2 controls the second RF generation unit 31b to generate a bias RF signal (bias RF power) which satisfies corrected LF_pw. The generated bias RF signal (bias RF power) is supplied to at least one lower electrode.

Next, the control unit 2 outputs the various correction values (step S108). The correction values output by the control unit 2 include the correction value of FRDC_V calculated in step S105 and the correction value of RF_pw calculated in step S107. The control unit 2 outputs information including the correction values to an external computer through the communication interface 2a3. The external computer may be a management server that comprehensively manages a plurality of plasma processing apparatuses 1, or may be, for example, a mobile terminal carried by, for example, an operator of the plasma processing apparatus 1. When the computer 2a is equipped with a display such as a liquid crystal display, the control unit 2 may cause the display to display the information including the correction values.

Next, the control unit 2 determines whether the process has ended (step S109). The end of the process is determined based on the recipe. When it is determined that the process has not ended (S109: NO), the control unit 2 returns the process to step S104. When it is determined that the process has ended (S109: YES), the control unit 2 ends the process according to the flowchart.

FIG. 7 is a view illustrating an example of the output of the correction values. When the correction values of FRDC_V and RF_pw are calculated, the control unit 2 generates a correction value table in which each output item is associated with its value as illustrated in FIG. 7, and outputs the table in step S108.

The correction value table illustrated in FIG. 7 includes FRDC_Current, FRDC_Delta, and FRDC(Optimized) as output items related to the correction of FRDC_V. Here, FRDC_Current represents a current control value of FRDC_V. FRDC_Delta is the connection amount of FRDC_V, and represents a difference from the current control value. FRDC(Optimized) represents the correction value of FRDC_A (a control value of corrected FRDC_V).

The correction value table illustrated in FIG. 7 further includes LF_Power_Current, LF_Power_Delta, LF_Power_Delta(Pcentage), and LF_Power (Optimized) as output items related to LF_pw. Here, LF_Power_Current represents a current control value of LF_pw. LF_Power_Delta is the correction amount of LF_pw, and represents a difference from the current control value. LF_Power_Delta(Pcentage) is a correction rate of LF_pw, and represents a change rate with respect to the current control value. LF_Power(Optimized) represents the correction value of LF_pw (a control value of corrected LF_pw).

The correction value table illustrated in FIG. 7 further includes HF_Power_Current, HF_Power_Delta, HF_Power_ Delta(Pcentage), and HF_Power(Optimize as output items related to HF_pw. Here, HF_Power_Current represents a current control value of HF_pw. HF_Power_ Delta is the correction amount of HF_pw, and represents a difference from the current control value. HF_Power_Delta (Pcentage) is a correction rate of HF_pw, and represents a change rate with respect to the current control value. HF_Power(Optimized) represents the correction value of HF_pw (a control value of corrected HF_pw).

The output items of the correction value table are not limited to those illustrated in FIG. 7, and may be appropriately set. For example, the correction value table may include values measured during the execution of the process, such as the RF application time, FRDC_V, LF_Vpp, LF_pw, HF_Vpp, and HF_pw as output items. Further, the correction value table may include parameters used for a correction calculation, such as the initial Vpp and the correction coefficients $\alpha$, $\beta$ and $\gamma$, as output items. Further, the correction value table may include control ranges (upper and lower limits) of, for example, FRDC_V, LF_Vpp, LF_pw, HF_Vpp, and HF_pw as output items.

The control unit 2 may output the generated correction value table to the external computer through the communication interface 2a3. Further, the control unit 2 may cause the display to display the generated correction value table.

As described above, in Embodiment 1, the control unit 2 corrects FRDC_V according to the RF application time, so that the deterioration of the process characteristics caused from the wear of the edge ring 112a may be suppressed. Further, in Embodiment 1, the control unit 2 corrects RF_pw when average LF_Vpp exceeds the threshold value or when FRDC_V is corrected, so that the deterioration of the product characteristics may be suppressed.

In Embodiment 1, the control unit 2 executes the correction process. However, the correction process may be executed in an external server such as a cloud server capable of communicating with the control unit 2. Further, the program installed in the control unit 2 may be provided as a program product.

Embodiment 2

In Embodiment 2, the peak-to-peak voltage of the source power (HF_Vpp) is monitored, and the source power and the bias power are corrected according to the fluctuation of HF_Vpp.

Since, for example, the entire configuration of the plasma processing system, the internal configuration of the plasma processing apparatus 1, and the internal configuration of the control unit 2 are the same as those in Embodiment 1, description thereof will be omitted.

Figure 8:
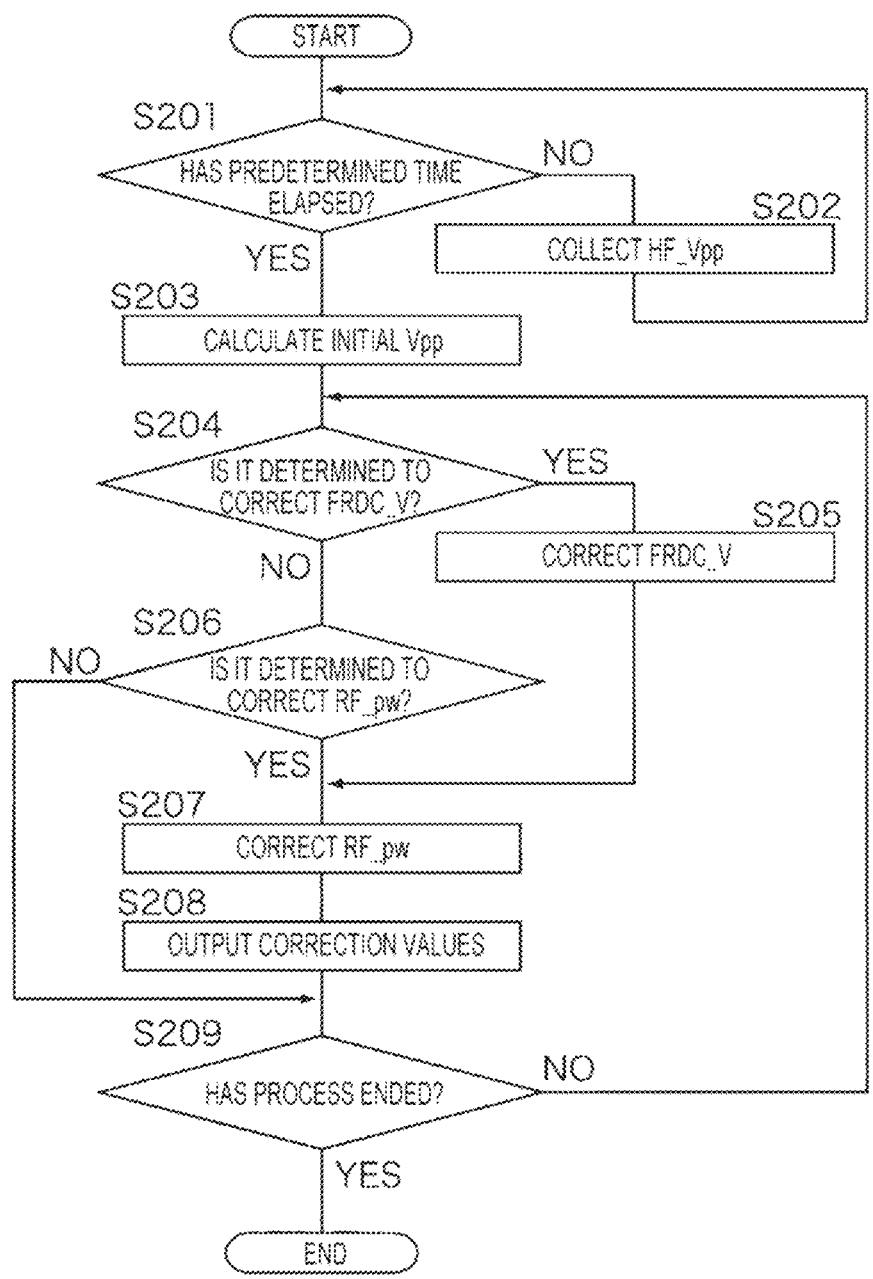
FIG. 8 is a flowchart illustrating a procedure for executing a correction process according to Embodiment 2.

FIG. 8 is a flowchart illustrating an execution procedure of the correction process according to Embodiment 2. After consumables including the edge ring 112a in the plasma processing apparatus 1 are replaced, and the process according to the recipe defining process steps is started, the control unit 2 executes the following procedure. The control unit 2 counts an elapsed time from the start of the process in the plasma processing apparatus 1, and determines whether a predetermined time (e.g., 25 hours) has elapsed (step S201).

When it is determined that the predetermined time has not elapsed (S201: NO), the control unit 2 collects the value of HF_Vpp (step S202). The control unit 2 stores the collected values of Vpp in association with timings in the storage unit 2a2, and returns the process to step S201.

When it is determined that the predetermined time has elapsed (S201: YES), the control unit 2 calculates the initial Vpp based on the values of HF_Vpp stored in the storage unit 2a2 (step S203). The control unit 2 calculates the average value of LF_Vpp stored in the storage unit 2a2 as the initial Vpp. Alternatively, the control unit 2 may calculate a median value or a moving average of LF_Vpp stored in the storage unit 2a2 as the initial Vpp. The control unit 2 stores the calculated initial Vpp in the storage unit 2a2.

Next, the control unit 2 determines whether to correct FRDC_V (step S204), In the present embodiment, the control unit 2 corrects FRDC_V each time the RF application time elapses by 50 hours. In this case, the control unit 2 may determine whether to correct FRDC_V, by determining whether 50 hours have elapsed since the start of the process or whether 50 hours have elapsed since a previous correction.

When it is determined in step S204 to perform the correction (S104: YES), the control unit 2 corrects FRDC_V (step S205). The control unit 2 increases FRDC applied to the edge ring 112a by a predetermined increase amount, by controlling the operation of the variable DC power supply 33. It is assumed that the increase amount is stored in advance in the storage unit 2a2. In an example, the increase amount is 25 V until the RF application time elapses by total 200 hours, and is 12.5 V after the elapse of 200 hours. After correcting FRDC_V, the control unit 2 executes the process of step S207 to be described later, so as to correct RF_pw as well.

When it is determined in step S204 not to perform the correction (S104: NO), the control unit 2 determines whether to correct RF_pw (step S206). The control unit 2 monitors HF_Vpp, and may determine to correct RF_pw, for example, when average HF_Vpp exceeds a threshold value. The threshold value is set to, for example, a value which is 1.005 times the initial Vpp calculated in step S203.

When it is determined in step S206 not to correct RF_pw (S206: NO), the control unit 2 executes the processes of step S209 and its subsequent step.

When it is determined in step S206 to correct RF_pw (S206: YES) or when FRDC_V is corrected in step S205, the control unit 2 corrects RF_pw (step S207). In step S207, the control unit 2 corrects both the bias power and the source power. Specifically, as in Embodiment 1, the control unit 2 corrects both the bias power and the source power such that monitored HF_Vpp approaches the initial set value (initial Vpp) while fixing the ratio of HF_pw and LF_pw.

The control unit 2 controls the first RF generation unit 31a to generate a source RF signal (source RF power) that satisfies corrected HF_pw. The generated source RF signal (source RF power) is supplied to at least one lower electrode and/or at least one upper electrode. Further, the control unit 2 controls the second RF generation unit 31b to generate a bias RF signal (bias RF power) that satisfies corrected LF_pw. The generated bias RF signal (bias RF power) is supplied to at least one lower electrode.

Next, the control unit 2 outputs the various correction values (step S208). The correction values output by the control unit 2 are the same as those in Embodiment 1. The control unit 2 outputs information including the correction values to an external computer through the communication interface 2a3. The external computer may be a management server that comprehensively manages a plurality of plasma processing apparatuses 1, or may be, for example, a mobile terminal carried by, for example, an operator of the plasma processing apparatus 1. When the computer 2a is equipped with a display such as a liquid crystal display, the control unit 2 may cause the display to display the information including the correction values.

Next, the control unit 2 determines whether the process has ended (step S209), The end of the process is determined based on the recipe. When it is determined that the process has not ended (S209: NO), the control unit 2 returns the process to step S204. When it is determined that the process has ended (S209: YES), the control unit 2 ends the process according to the flowchart.

Embodiment 3

As described above, a pulse voltage may be applied to the lower electrode of the plasma processing apparatus 1. In this case, the control unit 2 may monitor a current value of the pulse voltage applied to the lower electrode of the plasma processing apparatus 1, and correct the source power and the pulse voltage according to the fluctuation of the monitored current value. In Embodiment 3, the source power and the pulse voltage are corrected according to the fluctuation of the current value of the pulse voltage applied to the lower electrode.

Since, for example, the entire configuration of the plasma processing system, the internal configuration of the plasma processing apparatus 1, and the internal configuration of the control unit 2 are the same as those in Embodiment 1, description thereof will be omitted.

Figure 9:
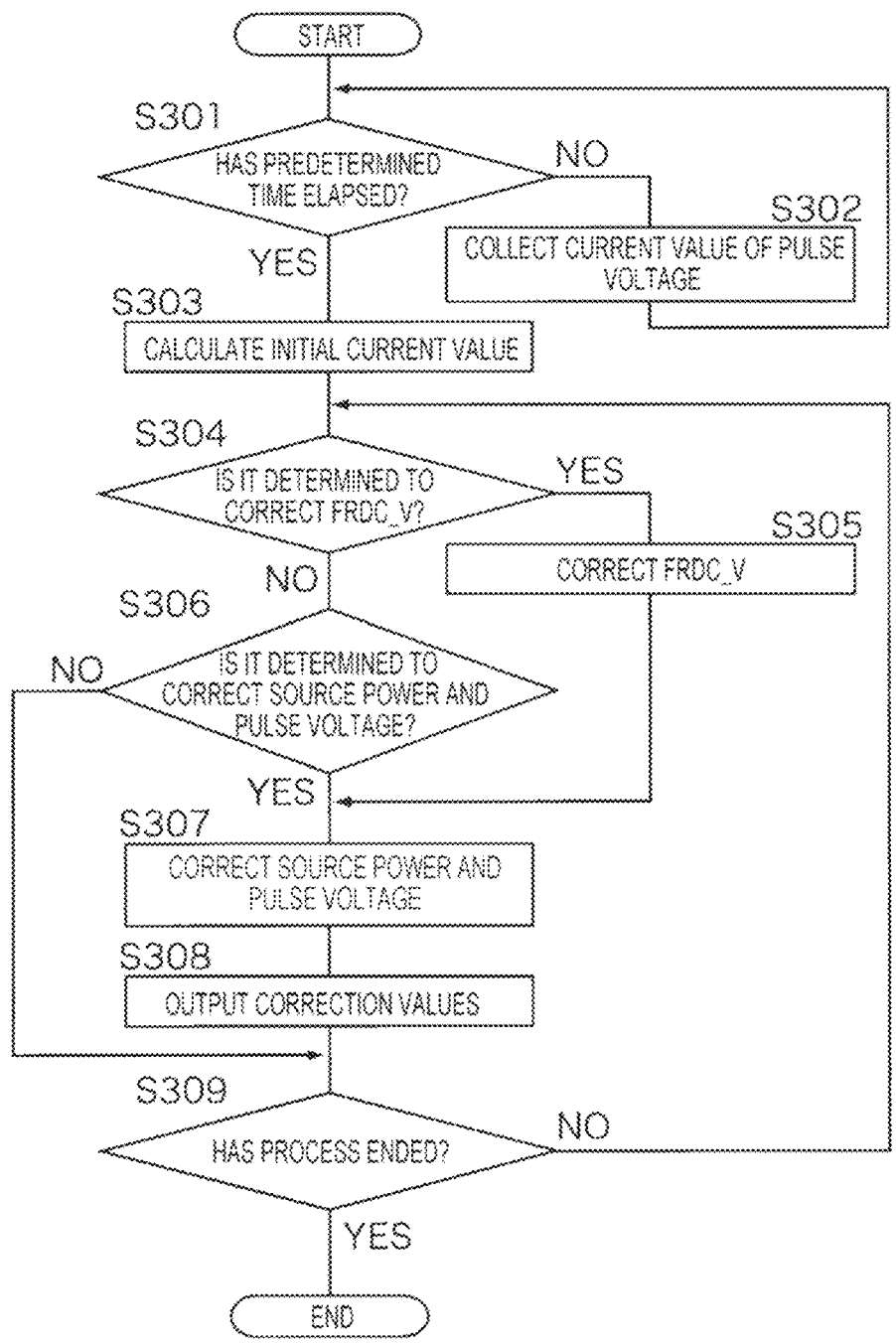
FIG. 9 is a flowchart illustrating a procedure for executing a correction process according to Embodiment 3.

FIG. 9 is a flowchart illustrating an execution procedure of the correction process according to Embodiment 3. After consumables including the edge ring 112*a* in the plasma processing apparatus 1 are replaced, and the process according to the recipe defining process steps is started, the control unit 2 executes the following procedure. The control unit 2 counts an elapsed time from the start of the process in the plasma processing apparatus 1, and determines whether a predetermined time (e.g., 25 hours) has elapsed (step S301).

When it is determined that the predetermined time has not elapsed (S301: NO), the control unit 2 collects the current value of the pulse voltage applied to the lower electrode (step S302). The control unit 2 stores the collected current values in association with timings in the storage unit 2*a*2, and returns the process to step S301.

When it is determined that the predetermined time has elapsed (S301: YES), the control unit 2 calculates an initial current value based on the current values stored in the storage unit 2*a*2 (step S303). The control unit 2 calculates an average value of the current values stored in the storage unit 2*a*2 as the initial current value. Alternatively, the control unit 2 may calculate a median value or a moving average of the current values stored in the storage unit 2*a*2 as the initial current value. The control unit 2 stores the calculated initial current value in the storage unit 2*a*2.

Next, the control unit 2 determines whether to correct FRDC_V (step S304). In the present embodiment, the control unit 2 corrects FRDC_V each time the RF application time elapses by 50 hours. In this case, the control unit 2 may determine whether to correct FRDC_V, by determining whether 50 hours have elapsed since the start of the process or whether 50 hours have elapsed since a previous correction.

When it is determined in step S304 to perform the correction (S304: YES), the control unit 2 corrects FRDC_V (step S305). The control unit 2 increases FRDC_V applied to the edge ring 112*a* by a predetermined increase amount, by controlling the operation of the variable DC power supply 33. It is assumed that the increase amount is stored in advance in the storage unit 2*a*2. In an example, the increase amount is 25 V until the RF application time elapses by total 200 hours, and is 12.5 V after the elapse of 200 hours. After correcting FRDC_V, the control unit 2 executes the process of step S307 to be described later, so as to correct the source power and the pulse voltage as well.

When it is determined in step S304 not to perform the correction (S304: NO), the control unit 2 determines whether to correct the source power and the pulse voltage (step S306). The control unit 2 monitors the current value of the pulse voltage applied to the lower electrode, and may determine to correct the source power and the pulse voltage when the monitored current value exceeds a threshold value. The threshold value is set based on, for example, the initial current value calculated in step S303.

When it is determined in step S306 not to perform the correction (S306: NO), the control unit 2 executes the processes of step S309 and its subsequent step.

When it is determined in step S306 to perform the correction (S306: YES), or when FRDC_V is corrected in step S305, the control unit 2 corrects the source power for generating plasma and the pulse voltage applied to the lower electrode (step S307). Specifically, the control unit 2 corrects both the source power and the pulse voltage such that the monitored current value of the pulse voltage approaches the initial current value while fixing the ratio of the source power and the pulse voltage.

The control unit 2 controls the first RF generation unit 31*a* to generate a source RF signal (source RF power) that satisfies corrected HF_pw. The generated source RF signal (source RF power) is supplied to at least one lower electrode and; or at least one upper electrode. Further, the control unit 2 controls the first DC generation unit 3*a*2 to generate the corrected pulse voltage. The generated pulse voltage is supplied to at least one lower electrode.

Next, the control unit 2 outputs the various correction values (step S308). The correction values output by the control unit 2 include the correction value of FRDC_V calculated in step S305 and the correction values of the source power and the pulse voltage calculated in step S307: The control unit 2 outputs information including the correction values to an external computer through the communication interface 2*a*3. The external computer may be a management server that comprehensively manages a plurality of plasma processing apparatuses 1, or may be, for example, a mobile terminal carried by, for example, an operator of the plasma processing apparatus 1. When the computer 2*a* is equipped with a display such as a liquid crystal display, the control unit 2 may cause the display to display the information including the correction values.

Next, the control unit 2 determines whether the process has ended (step S309). The end of the process is determined based on the recipe. When it is determined that the process has not ended (S309: NO), the control unit 2 returns the process to step S204. When it is determined that the process has ended (S309: YES), the control unit 2 ends the process according to the flowchart.

Embodiment 4

In the plasma processing apparatus 1 according to Embodiment 4, instead of FRDC_V, a pulse voltage is applied to the edge ring 12*a*. For example, the first DC generation unit 32*a* included in the plasma processing apparatus 1 applies a pulse voltage to at least one lower electrode, and also applies a pulse voltage to the edge ring 112*a*. In the plasma processing apparatus 1, in addition to correcting the pulse voltage applied to the edge ring 112*a*, the source power for generating plasma and the pulse voltage applied to the lower electrode may also be corrected. In Embodiment 4, the pulse voltage applied to the edge ring 112*a* will be referred to as a first pulse voltage, and the pulse voltage applied to the lower electrode will be referred to as a second pulse voltage.

Figure 10:
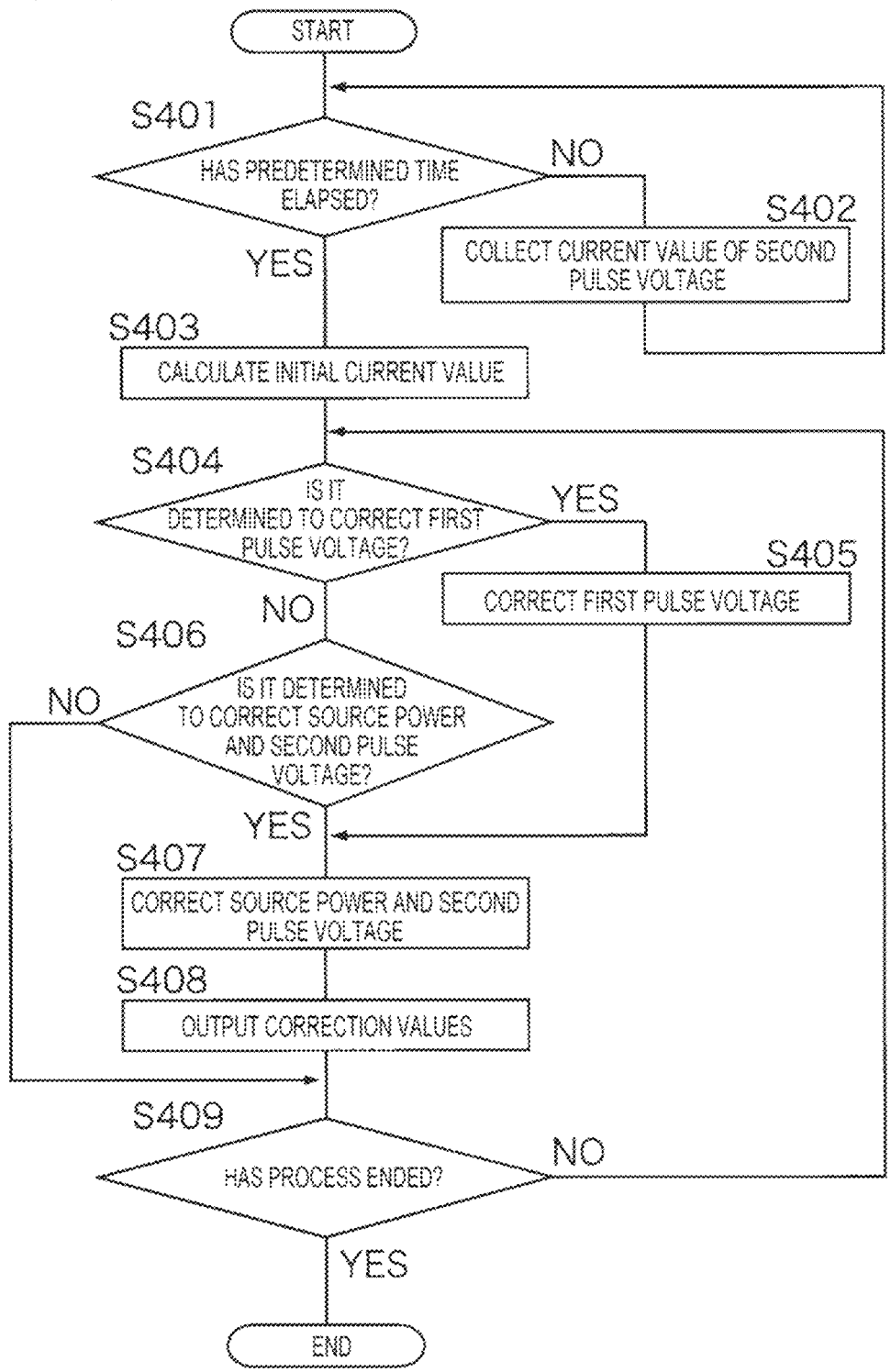
FIG. 10 is a flowchart illustrating a procedure for executing a correction process according to Embodiment 4.

FIG. 10 is a flowchart illustrating an execution procedure of the correction process according to Embodiment 4. After consumables including the edge ring 112*a* in the plasma processing apparatus 1 are replaced, and the process according to the recipe defining process steps is started, the control unit 2 executes the following procedure. The control unit 2 counts an elapsed time from the start of the process in the plasma processing apparatus 1, and determines whether a predetermined time (e.g., 25 hours) has elapsed (step S401).

When it is determined that the predetermined time has not elapsed (S401: NO), the control unit 2 collects a current value of the second pulse voltage (step S402). The control unit 2 stores the collected current values in association with timings in the storage unit 2*a*2, and returns the process to step S401.

When it is determined that the predetermined time has elapsed (S401: YES), the control unit 2 calculates an initial current value based on the current values stored in the storage unit 2a2 (step S403). The control unit 2 calculates an average value of the current values stored in the storage unit 2a2 as the initial current value. Alternatively, the control unit 2 may calculate a median value or a moving average of the current values stored in the storage unit 2a2 as the initial current value. The control unit 2 stores the calculated initial current value in the storage unit 2a2.

Next, the control unit 2 determines whether to correct the first pulse voltage (step S404). In the present embodiment, the control unit 2 corrects the first pulse voltage each time the RF application time elapses by 50 hours. In this case, the control unit 2 may determine whether to correct the first pulse voltage, by determining whether 50 hours have elapsed since the start of the process or whether 50 hours have elapsed since a previous correction.

When it is determined in step S404 to perform the correction (S404: YES), the control unit 2 corrects the first pulse voltage (step S405). The control unit 2 increases the magnitude of the pulse voltage applied to the edge ring 112a by controlling the operation of the first DC generation unit 32a. It is assumed that the increase amount is stored in advance in the storage unit 2a2. After correcting the first pulse voltage, the control unit 2 executes the process of step S407 to be described later, so as to correct the source power and the second pulse voltage as well.

When it is determined in step S404 not to perform the correction (S404: NO), the control unit 2 determines whether to correct the source power and the second pulse voltage (step S406). The control unit 2 monitors the current value of the second pulse voltage applied to the lower electrode, and may determine to correct the source power and the second pulse voltage when the monitored current value exceeds a threshold value. The threshold value is set based on, for example, the initial current value calculated in step S403.

When it is determined in step S406 not to perform the correction (S406: NO), the control unit 2 executes the processes of step S409 and its subsequent step.

When it is determined in step S406 to perform the correction (S406: YES), or when the first pulse voltage is corrected in step S405, the control unit 2 corrects the source power and the second pulse voltage (step S407). Specifically, the control unit 2 corrects both the source power and the pulse voltage such that the monitored current value of the second pulse voltage approaches the initial current value while fixing the ratio of the source power and the pulse voltage.

The control unit 2 controls the first RF generation unit 31a to generate a source RF signal (source RF power) that satisfies corrected HF_pw. The generated source RF signal (source RF power) is supplied to at least one lower electrode and/or at least one upper electrode. Further, the control unit 2 controls the first DC generation unit 32a to generate the corrected second pulse voltage. The generated second pulse voltage is supplied to at least one lower electrode.

Next, the control unit 2 outputs the various correction values (step S408). The correction values output by the control unit 2 include the correction value of the first pulse voltage calculated in step S405 and the correction values of the source power and the second pulse voltage calculated in step S407. The control unit 2 outputs information including the correction values to an external computer through the communication interface 2a3. The external computer may be a management server that comprehensively manages a plurality of plasma processing apparatuses 1, or may be, for example, a mobile terminal carried by, for example, an operator of the plasma processing apparatus 1. When the computer 2a is equipped with a display such as a liquid crystal display, the control unit 2 may cause the display to display the information including the correction values.

Next, the control unit 2 determines whether the process has ended (step S409). The end of the process is determined based on the recipe. When it is determined that the process has not ended (S409: NO), the control unit 2 returns the process to step S404. When it is determined that the process has ended (S409: YES), the control unit 2 ends the process according to the flowchart.

Embodiment 5

In Embodiment 5, an overcorrection preventing function will be described.

Since the configuration of the plasma processing apparatus 1 or the configuration of the control unit 2 is the same as those in Embodiment 1, description thereof will be omitted.

As described in Embodiment 1, the control unit 2 corrects LF_pw and HF_pw based on Equations 1 and 2 when average LF_Vpp exceeds the threshold value or when FRDC_V is corrected. However, when the correction amount is large, the source power or the bias power becomes low, and as a result, a required process performance may not be implemented. Thus, in Embodiment 5, an overcorrection preventing function is provided for the corrections of LF_pw and HF_pw.

Figure 11:
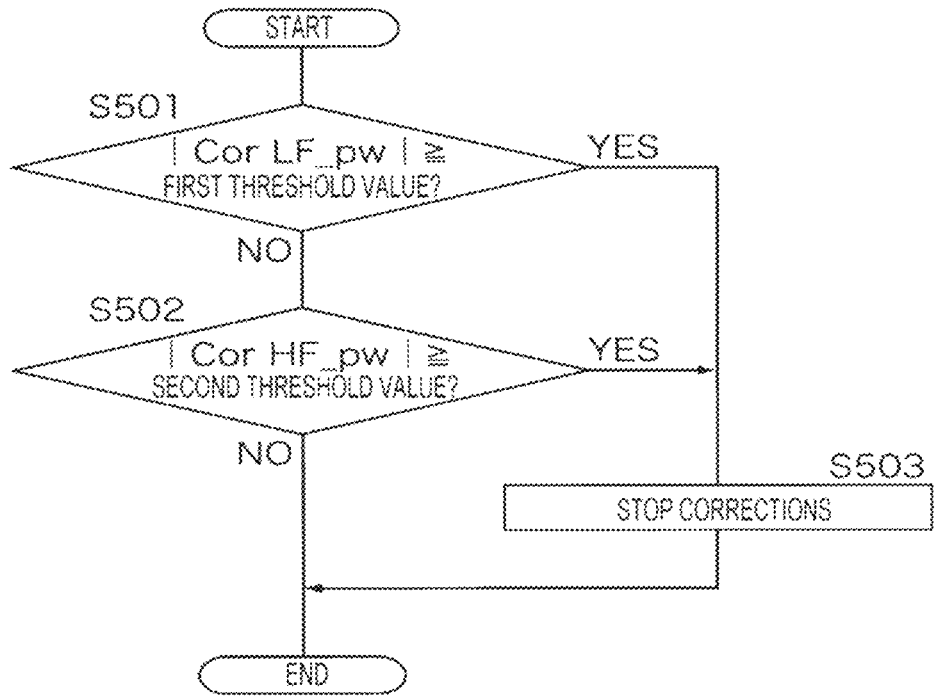
FIG. 11 is a flowchart illustrating a procedure for executing an overcorrection preventing process.

FIG. 11 is a flowchart illustrating an execution procedure of an overcorrection preventing process. When the correction amounts for LF_pw and HF_pw are calculated, the control unit 2 performs the following process.

In step S501, the control unit 2 determines whether an absolute value of the correction amount for LF_pw (|Cor LF_pw|) is equal to or more than a first threshold value. The first threshold value is set to, for example, a value of 5% of current LF_pw (LF_pw×0.05). The first threshold value is not limited to the value of 5% of LF_pw, and may be appropriately set.

In step S502, the control unit 2 determines whether an absolute value of the correction amount for HF_pw (|Cor HF_pw|) is equal to or more than a second threshold value. The second threshold value is set to, for example, a value of 5% of current HF_pw (HF_pw×0.05). The second threshold value is not limited to the value of 5% of HF_pw, and may be appropriately set.

When it is determined in step S501 that |Cor LF_pw| is equal to or more than the first threshold value, or when it is determined in step S502 that |Cor HF_pw| is equal to or more than the second threshold value, the control unit 2 stops the corrections of LF_pw and HF_pw (step S503). In this case, the process continues without changing LF_pw and HF_pw.

Meanwhile, when it is determined in step S501 that |Cor LF_pw| is less than the first threshold value, or when it is determined in step S502 that |Cor HF_pw| is less than the second threshold value, the control unit 2 ends the process according to the flowchart without stopping the corrections. In this case, LF_pw and HF_pw are corrected, and the process continues.

As described above, in Embodiment 5, the overcorrection preventing function is provided for the corrections of LF_pw and HF_pw, so that the value of the source power or the bias power may be prevented from becoming lower than an assumed range.

Embodiment 6

In Embodiment 6, a procedure for calibrating the correction coefficients α, β, and γ will be described.

Since the configuration of the plasma processing apparatus 1 or the configuration of the control unit 2 is the same as those in Embodiment 1, description thereof will be omitted.

In a plasma processing apparatus, generally, the inside of a processing chamber is periodically opened to the atmosphere, so as to perform a so-called wet cleaning, such as replacing components including an edge ring or removing deposits inside the processing chamber. However, since the atmosphere in the processing chamber immediately after the wet cleaning is different from the atmosphere during a stable mass production, the plasma processing performance changes before and after the wet cleaning.

In order to solve this problem, a plasma processing is performed to simulate the plasma processing during the mass production (hereinafter, referred to as a seasoning process), so that the state of the inside of the processing chamber becomes close to the state during the stable mass production. In many cases of the seasoning process, the plasma processing during the mass production is simulated by performing a plasma processing using a dummy target object different from a product target object.

In Embodiment 6, the correction coefficients are calibrated for each seasoning process by incorporating a step for calibrating the correction coefficients α, β, and γ into a seasoning recipe describing the procedure of the seasoning process. It is assumed that various recipes including the seasoning recipe which incorporates the step for calibrating the correction coefficients are stored in advance in, for example, the storage unit 2a2 of the control unit 2.

Figure 12:
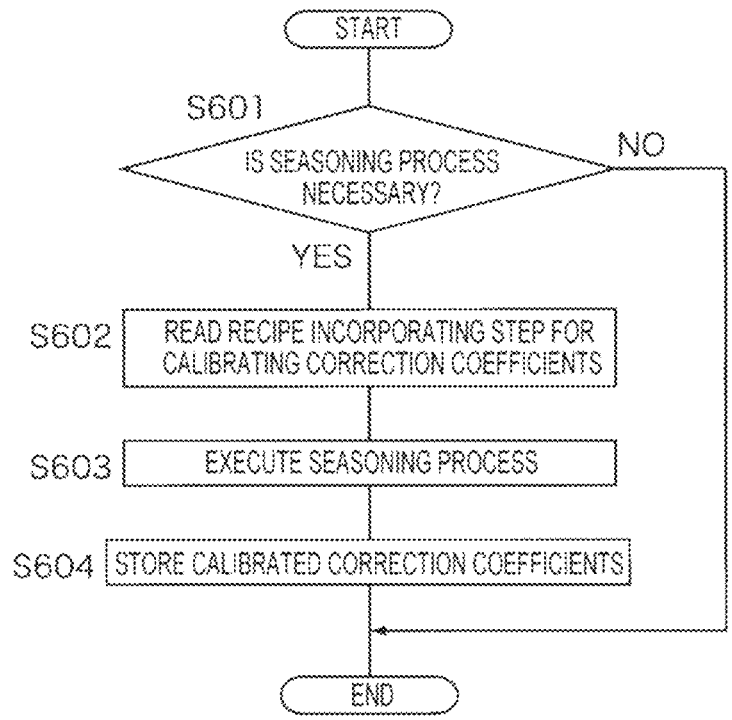
FIG. 12 is a flowchart illustrating a procedure for calibrating correction coefficients.

FIG. 12 is a flowchart illustrating a procedure for calibrating the correction coefficients. The control unit 2 determines whether the seasoning process is necessary (step S601). When the plasma processing chamber 10 is opened to the atmosphere in order to replace the components of the plasma processing apparatus 1 including the edge ring 112a or to remove deposits in the processing chamber, the control unit 2 determines that the seasoning process is necessary. When it is determined that the seasoning process is unnecessary (S601: NO), the control unit 2 ends the process according to the flowchart.

When it is determined that the seasoning process is necessary (S601: YES), the control unit 2 reads the seasoning recipe which incorporates the step for calibrating the correction coefficients, from the storage unit 2a2 (step S602), and performs the seasoning process according to the read seasoning recipe (step S603).

The control unit 2 calibrates the correction coefficients α, β, and γ according to the step for calibrating the correction coefficients, during the execution of the seasoning process. The control unit 2 may calibrate the correction coefficients α, β, and γ by, for example, analyzing the values of LF_pw, LF_Vpp, HF_pw, and HF_Vpp measured in the step for calibrating the correction coefficients.

Since the calibrated correction coefficients α, β, and γ are obtained by executing the seasoning recipe which incorporates the step for calibrating the correction coefficients, the control unit 2 stores the obtained correction coefficients α, β, and γ in the storage unit 2a2 (step S604).

When a plurality of types of seasoning recipes with different numbers of steps is prepared, an initial value or a calibrating method when the correction coefficients are calibrated may differ for each seasoning recipe.

As described above, in Embodiment 6, the correction coefficients are calibrated each time the seasoning process is executed, so that the source power or the bias power may be corrected by using appropriate correction coefficients, regardless of the individual difference of the plasma processing apparatus 1.

In Embodiment 6, the correction coefficients are calibrated by incorporating the step for calibrating the correction coefficients α, β, and γ into the seasoning recipe. However, a separate recipe for correcting the coefficients may be implemented without incorporating the step into the seasoning recipe.

In the embodiments, descriptions have been made on an example to which the capacitively coupled plasma processing apparatus 1 is applied. However, without being limited to the capacitively coupled plasma, the present disclosure may be applied to a plasma processing apparatus of any type of inductively coupled plasma (ICP), radial line slot antenna (RIBA), electron cyclotron resonance plasma (ECR), and helicon wave plasma (HWP).

In the embodiments, the wafer W is described as an example of the processing target substrate. However, without being limited to the wafer W, the processing target substrate may be various substrates or a printed substrate used for a flat panel display (FPD).

According to the present disclosure, it is possible to suppress a deterioration of process characteristics caused from the wear of members provided in a chamber or an individual difference of a plasma processing apparatus in process characteristics.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A non-transitory computer-readable storage medium storing a control program of a plasma processing apparatus which performs a plasma processing by supplying a source power to a plasma generator and supplying a bias power to a stage that places a processing target substrate thereon, the control program causing a computer to execute a process including:
monitoring a peak-to-peak voltage value of the source power or the bias power; and
correcting the source power supplied to the plasma generator and the bias power supplied to the stage according to a fluctuation of the peak-to-peak voltage value of the source power or the bias power, to make the monitored peak-to-peak voltage value of the source power or the bias power approach an initial set value while fixing a ratio of the source power and the bias power.

2. The non-transitory computer-readable storage medium according to claim 1, wherein the process further includes correcting a value of a DC voltage applied to an edge ring disposed around the stage, according to an application time of the source power and the bias power.

3. The non-transitory computer-readable storage medium according to claim 2, wherein when the monitored peak-topeak voltage of the source power or the bias power value exceeds a threshold value or when the value of the DC voltage is corrected, the source power and the bias power are corrected.

4. The non-transitory computer-readable storage medium according to claim 2, wherein the process further includes calibrating correction coefficients used for correcting the source power and the bias power, for each seasoning process performed after components including the edge ring are replaced.

5. The non-transitory computer-readable storage medium according to claim 4, wherein the correction coefficients are calibrated by executing the seasoning process based on a seasoning recipe which incorporates a step of calibrating the correction coefficients.

6. The non-transitory computer-readable storage medium according to claim 4, wherein the process further includes:
    collecting the peak-to-peak voltage value of the source power or the bias power after the correction coefficients are calibrated, and
    calculating the initial set value based on a result of the collection.

7. The non-transitory computer-readable storage medium according to claim 1, wherein the process further includes outputting an alarm when the corrected source power or bias power exceeds a set range.

8. The non-transitory computer-readable storage medium of claim 1, wherein the process further includes: correcting the source power and the bias power according to a correction amount calculated based on an RF application time during which the source power and the bias power are supplied, to compensate for a step in a plasma sheath caused by a reduction in thickness of the edge ring.

9. The non-transitory computer-readable storage medium of claim 1, wherein the process further includes:
    stopping the correction of the source power and the bias power when a correction amount for the source power or the bias power is equal to or greater than a threshold value, to prevent the source power or the bias power from becoming lower than a required process performance range.

10. A control method comprising:
    providing a plasma processing apparatus which performs a plasma processing by supplying a source power to a plasma generation source and supplying a bias power to a stage that places a processing target substrate thereon;
    monitoring a peak-to-peak voltage value of the source power or the bias power; and
    correcting the source power supplied to the plasma generator and the bias power supplied to the stage according to a fluctuation of the peak-to-peak voltage value of the source power or the bias power, to make the monitored peak-to-peak voltage value of the source power or the bias power approach an initial set value while fixing a ratio of the source power and the bias power.

11. The control method of claim 10, wherein correcting the source power and the bias power includes:
    calculating a correction amount for the bias power using a correction formula that includes an average of the monitored peak-to-peak voltage value of the bias power and an initial set value; and
    calibrating correction coefficients of the correction formula during a seasoning process performed after replacement of the edge ring.

12. A plasma generating apparatus comprising:
    a stage configured to place a processing target substrate thereon;
    an edge ring disposed around the stage;
    a first power supply configured to supply a source power to a plasma generator;
    a second power supply configured to supply a bias power to the stage;
    a third power supply configured to apply a DC voltage to the edge ring; and
    a controller configured to:
        monitor a peak-to-peak voltage value of the source power or the bias power;
        correct the source power supplied by the first power supply and the bias power supplied by the second power supply according to a fluctuation of the peak-to-peak voltage value of the source power or the bias power, to make the monitored peak-to-peak voltage value of the source power or the bias power approach an initial set value while fixing a ratio of the source power and the bias power; and
        control operations of the first power supply and the second power supply to supply the corrected source power and bias power to the plasma generator and the stage, respectively.

13. The plasma generating apparatus of claim 12, wherein the controller is further configured to:
    store values of the peak-to-peak voltage of the source power or the bias power in association with timings during plasma processing; and
    correct the source power and the bias power when an average of the stored peak-to-peak voltage values of the source power or the bias power exceeds a threshold value, to suppress tilting of recesses formed in the processing target substrate due to wear of the edge ring.

14. A plasma generating apparatus comprising:
    a stage configured to place a processing target substrate thereon;
    an edge ring disposed around the stage;
    a first power supply configured to supply a source power to a plasma generator;
    a second power supply configured to supply a pulse voltage to the stage;
    a third power supply configured to apply a DC voltage to the edge ring; and
    a controller having a processor and a memory with a computer readable program stored therein, the controller being configured to:
        monitor a current value of the pulse voltage;
        correct the source power supplied by the first power supply and the pulse voltage applied by the second power supply according to a fluctuation of the current value, to make the monitored current value of the pulse voltage approach an initial set value while fixing a ratio of the source power and the pulse voltage; and
        control operations of the first power supply and the second power supply to supply the corrected source power to the plasma generator, thereby applying the corrected pulse voltage to the stage.

15. The plasma generating apparatus of claim 14, wherein the controller is further configured to:
    correct the source power and the pulse voltage when the monitored current value of the pulse voltage exceeds a threshold value set based on an initial current value, to suppress a deterioration of process characteristics caused by wear of the edge ring.

\* \* \* \* \*